(12) United States Patent
Voiron et al.

(10) Patent No.: US 9,793,340 B2
(45) Date of Patent: Oct. 17, 2017

(54) CAPACITOR STRUCTURE

(71) Applicant: IPDIA, Caen (FR)

(72) Inventors: Frédéric Voiron, Barraux (FR); Jean-René Tenailleau, Hottot-les-Bagues (FR)

(73) Assignee: IPDIA, Caen (FR)

( * ) Notice: Subject to any disclaimer, the term of this patent is extended or adjusted under 35 U.S.C. 154(b) by 0 days.

(21) Appl. No.: 15/122,502

(22) PCT Filed: Mar. 25, 2015

(86) PCT No.: PCT/EP2015/056380
§ 371 (c)(1),
(2) Date: Aug. 30, 2016

(87) PCT Pub. No.: WO2015/144755
PCT Pub. Date: Oct. 1, 2015

(65) Prior Publication Data
US 2017/0053979 A1    Feb. 23, 2017

(30) Foreign Application Priority Data
Mar. 25, 2014  (EP) .................................. 14161523

(51) Int. Cl.
*H01L 49/02*  (2006.01)
*H01L 29/66*  (2006.01)
(Continued)

(52) U.S. Cl.
CPC ............ *H01L 28/91* (2013.01); *H01L 25/074* (2013.01); *H01L 28/65* (2013.01); *H01L 28/75* (2013.01);
(Continued)

(58) Field of Classification Search
CPC ......... H01L 28/25; H01L 28/40; H01L 28/91; H01L 29/945
See application file for complete search history.

(56) References Cited

U.S. PATENT DOCUMENTS

| | | | |
|---|---|---|---|
| 6,310,400 B1 * | 10/2001 | Doyle | H01L 23/48 257/532 |
| 2005/0214971 A1 * | 9/2005 | Hung | H01L 21/563 438/106 |

(Continued)

FOREIGN PATENT DOCUMENTS

| | | |
|---|---|---|
| WO | 2007054858 | 5/2007 |
| WO | 2008139393 | 11/2008 |
| WO | 2009057010 | 5/2009 |

OTHER PUBLICATIONS

International Search Report for international application No. PCT/EP2015/056380, dated Jul. 9, 2015 (2 pages).

*Primary Examiner* — Tucker J Wright
(74) *Attorney, Agent, or Firm* — Arent Fox LLP (57) ABSTRACT

The invention relates to a capacitor structure (2) comprising a silicon substrate (4) with first and second sides (6, 8), a double double Metal Insulator Metal trench capacitor (10) including a basis electrode (12), an insulator layer (16, 20), a second and a third conductive layers (18, 22); and comprising a second pad (26) and a fourth pad (30) coupled to the basis electrode (12), a first pad (24) and a third pad (28) coupled together, the first pad (24) being located on the same substrate side than the second pad (26), the third pad (28) being located on the same substrate side than the fourth pad (30), the third pad (28) being coupled to the second conductive layer (18), said second conductive layer (18) being flush with or protruding from the opposite second side (8).

16 Claims, 4 Drawing Sheets

(51) Int. Cl.
    *H01L 25/07*    (2006.01)
    *H01L 29/94*    (2006.01)
(52) U.S. Cl.
    CPC ...... *H01L 29/66181* (2013.01); *H01L 29/945* (2013.01); *H01L 2224/16145* (2013.01)

(56) References Cited

U.S. PATENT DOCUMENTS

| | | |
|---|---|---|
| 2006/0016861 A1* | 1/2006 | Daubenspeck ...... B23K 3/0623 228/180.21 |
| 2010/0052099 A1 | 3/2010 | Chang et al. |
| 2012/0080772 A1* | 4/2012 | Asami ............... H01L 21/76898 257/532 |
| 2012/0146182 A1 | 6/2012 | Oganesian et al. |

\* cited by examiner

CAPACITOR STRUCTURE

The invention relates to a capacitor structure. The invention also relates to a process of fabrication allowing manufacturing the said capacitor structure.

Ultra high capacitor density is of major concern in the recent years for application like power-supply decoupling. Indeed, many applications such as cellular phones, tablets need a power supply efficient with an output voltage controlled, fixed and extremely stable.

For this type of application, surface mounted device components (SMC) are classically used externally and connected to a power supply grid at the board level allowing increasing the capacitor density. Thus, the output voltage provided by the power supply is better controlled.

However, this approach suffers the limitation that the induced equivalent serial resistance (ESR) losses of the SMC components connected to the power supply grid might be increased by the long interconnection paths. This is usually inadequate for proper decoupling when high rejection is researched.

To overcome this issue, WO2007/054858 proposes components using capacitor passive technology integrated into silicon allowing integration within a Silicon Integrated Package (SIP). This feature enables to reduce the length between interconnections and thus to decrease parasitic losses. Further, the reliability and the linearity of these circuits are improved. However this type of technology suffers relatively low density of integration that is limited for example to <1 µF/mm².

In order to increase the density integration WO2008/139393 proposes an integration substrate for a system in package comprises a through-substrate via and a trench capacitor wherein with a trench filling that includes at least four electrically conductive capacitor-electrode layers in an alternating arrangement with dielectric layers. The capacitor-electrode layers are alternatingly connected to a respective one of two capacitor terminals provided on the first or second substrate side. The trench capacitor and the through-substrate via are formed in respective trench openings and via openings in the semiconductor substrate. Thus, the density of integration is improved.

WO2009/057010 proposes a multilayer structure, in particular a trench capacitor with a patterned layer structure comprising trenches, and a first electrode, wherein the patterned layer structure comprises a FASS-curve structure, and wherein at least parts of the first electrode are formed on the FASS-curve structure. Thus, the density of integration is increased.

US2012/0080772 concerns a semiconductor device including a substrate, a first single conductor, a single insulator, and a second single conductor. The substrate includes first and second regions located adjacent to each other. The first region has blind holes, each of which has an opening on a front surface of the substrate. The second region has a through hole penetrating the substrate. A width of each blind hole is less than a width of the through hole. The first single conductor is formed on the front surface of the substrate in such a manner that an inner surface of each blind hole and an inner surface of the through hole are covered with the first single conductor. The single insulator is formed on the first single conductor. The second single conductor is formed on the single insulator and electrically insulated form the first single conductor.

The present invention aims to provide an alternative solution for increasing the capacitor density of the capacitor structure while controlling the serial resistivity losses. The capacitor structure proposed is both reliable and efficient, and in addition cheap to manufacture.

According to a first aspect of the invention, there is proposed a capacitor structure, comprising:
 a silicon substrate with a first side and an opposite second side,
 a trench etched in the semiconductor substrate,
 a double Metal Insulator Metal trench capacitor including:
  a basis electrode forming a first conductive layer sunk in the trench coupled to the substrate,
  a first insulator layer,
  an second conductive layer deposited on the first insulator layer,
  a second insulator layer,
  a third conductive layer deposited on the second insulator layer and coupled to the basis electrode,
characterized in that a second pad and a fourth pad are coupled to the basis electrode, wherein the second pad is located on the first side of the silicon substrate and the fourth pad is located on the opposite second side of the silicon substrate, and
in that a first pad and a third pad are coupled together and insulated on one hand to the silicon substrate and on the other hand to the second pad and the fourth pad, the first pad being located on the first side, the third pad being located on the opposite second side, the third pad being coupled to the second conductive layer, said second conductive layer being flush with or protruding from the opposite second side.

In an exemplary embodiment of the invention, the second pad and the fourth pad of the capacitor structure are coupled by the silicon substrate to the basis electrode allowing reducing serial losses.

Advantageously, the first pad and the third pad are symmetrical to the silicon substrate. Likewise, the second pad and the fourth pad are symmetrical to the silicon substrate in order to allow connections between several capacitor structures.

Advantageously, the third pad shorts the second conductive layer allowing reducing the intrinsic capacitor resistance (ESR) of the capacitor structure.

In an exemplary embodiment of the invention, the pads are formed with a low resistivity metal layer, for example copper allowing to minimize the intrinsic capacitor resistance (ESR).

Preferably, the third pad covers more than 60% of the second conductive layer.

The invention does not only concerns double MIM capacitor structures. It also concerns for example a structure with a third insulating layer deposited on the third conductive layer and a fourth conductive layer deposited on the third insulating layer. It is also possible to increase the number of MIM capacitors into the trench to obtain for example a MIMIMIMIM structure.

In this case, even conductive layers (corresponding to second, fourth . . . conductive layers) can be advantageously coupled together and odd conductive layers (corresponding to the first, third . . . conductive layers) can be coupled together allowing increasing the capacitor value of the capacitor structure.

In a second aspect of the invention, in order to optimise an integrated capacitor density value, it is proposed an electronic device comprising more than two capacitor structures with a first pad and a second pad of a capacitor structure soldered to a third pad and a fourth pad of a second neighbouring capacitor structure.

Advantageously, the capacitor structures of the electronic device are placed one above others.

In a third aspect of the invention, it is proposed a method for manufacturing a capacitor structure comprising the steps of:
  providing a silicon substrate having a first side and an opposite second side,
  forming a trench in the silicon substrate,
  forming a basis electrode in the trench,
  forming a double Metal Insulating Metal (MIM) trench capacitor by stacking:
    a first insulating layer on the basis electrode which forms a first conductive layer,
    a second conductive layer on the first insulating layer,
    a second insulating layer on the second conductive layer,
    a third conductive layer on the second insulating layer,
  etching an opposite second side of the silicon substrate until the first insulating layer,
  etching the first insulating layer,
  depositing a thick dielectric layer on the opposite second side,
  processing a first pad in connection with the first conductive layer and a second pad in connection with the silicon substrate, the first pad and the second pad being placed on the first side,
  processing a third pad in connection with the third conductive layer and a fourth pad in connection with the silicon substrate, the third pad and the fourth pad being placed on the opposite second side.

Moreover, in another exemplary embodiment of the invention, in order to increase the capacitor density the method comprises also the step of:
  depositing a third insulator layer on the third conductive layer, and
  depositing a fourth conductive layer on the third insulator layer.

In other embodiment of the invention in order to optimise the stacking of two capacitor structures a step of soldering a first pad and a second pad of a self stackable capacitor structure to a third pad and a fourth pad of a the neighbouring self stackable capacitor structure is realised.

To optimize the assembling of two capacitors structures the soldering step is a wafer bounding.

Embodiments of the present invention are illustrated by way of example, and not by way of limitation, in the figures of the accompanying drawings, in which like reference numerals refer to similar elements and in which.

Figure 1:
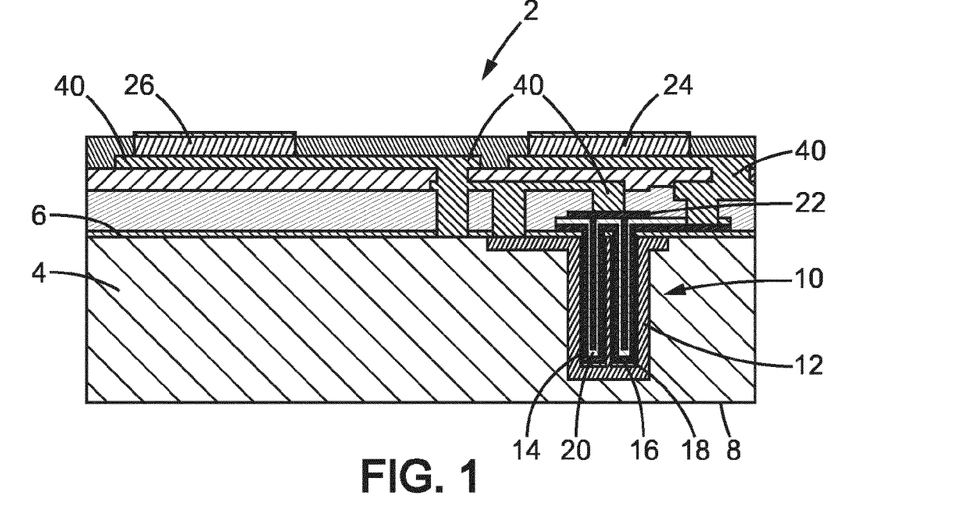
FIG. 1 is a schematic cross sectional view of a trench capacitor according to an embodiment of the invention.
Figure 7:
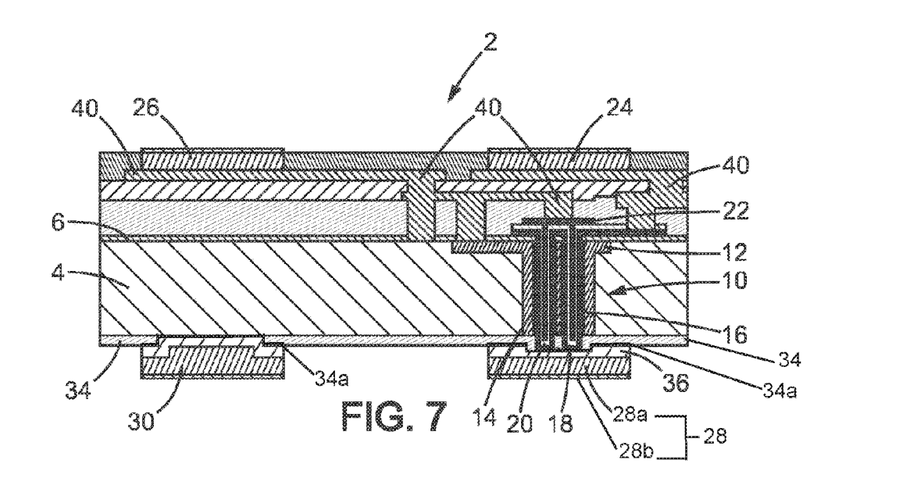
FIG. 7 is a schematic cross sectional view of the self stackable capacitor structure according to an embodiment of the invention.

FIG. 1 shows a schematic cross sectional view of a trench capacitor 10 which may be used for forming a self stackable capacitor structure 2 (FIG. 7). The trench capacitor 10 uses a support for instance a silicon substrate 4. The silicon substrate 4 comprises a first side 6 and an opposite second side 8.

The thickness of the silicon substrate 4 is adapted to improve an integrated capacitor density value of the trench capacitor 10. In an example of embodiment of the invention, the thickness of the silicon substrate 4 is approximately equal to 100 μm (1 μm=1×10$^{-6}$ m). A crystal orientation of the silicon substrate 4 is adapted to allow a dry and/or a wet etching with a desired angle according to the invention. In another embodiment of the invention, the support uses a SOI substrate (Silicon On Insulator).

Furthermore, characteristics of doping such as type of carriers and a concentration value of carriers are adapted to reduce the resistance between a basis electrode 12 and the silicon substrate 4. Advantageously, the concentration and the type of carriers allow modulating serial resistivity losses of the trench capacitor 10. The value of the concentration of the carriers is for instance equal to 1×10$^{18}$ cm$^{-3}$ and the carriers are positively charged (p type). Doping process being known of the skilled person of the art it will not be presented in more details in this description.

The silicon substrate 4 is etched in a determined area for manufacturing a trench 14. The trench 14 is realised by at least one etching step of the first side 6 of the silicon substrate 4. The etching step is for example realised by a wet etching step or by a dry etching step. In other embodiment of the invention, the etching step combines a step of dry etching with a step of wet etching of the first side 6 of the silicon substrate 4.

In an example of embodiment of the invention, the width of the trench 14 is typically ranging from 1 μm to 3 μm and its depth is typically ranging from 10 μm to 80 μm. Advantageously, a shape of the trench 14 is adapted to optimise layers deposition in said trench 14 and to increase the value of the integrated capacitor density. In a preferred embodiment, the shape of the trench 14 is a serpentine.

The basis electrode 12 (FIG. 1) is deposited in the trench 14 and is connected to the silicon substrate 4. It covers the bottom and the walls of the trench 14 and covers a determined area of the first side 6 of the silicon substrate 4 near the trench 14. The basis electrode 12 forms a first conductive layer and is realised for example by a dopant diffusion into the substrate 4 from a deposited doped glass layer that is subsequently removed, or by a deposition step of a conductive material like for example nickel (Ni), titanium nitride (TiN), tungsten (W), titanium (Ti) or polysilicon. The deposition process, being known of the skilled person of the art, will not be presented in more details in this description.

The thickness of the conductive layer of the basis electrode 12 is determined so that the serial resistivity losses of the trench capacitor 10 are minimal between the basis electrode 12 and the silicon substrate 4. In an example of embodiment of the invention, the thickness of the basis electrode 12 sunk in the trench 14 is equal to 200 nm (1 nm=1×10$^{-9}$ m). However, any other type of conductive layer can be used to manufacture the basis electrode 12.

A multilayer stack composed at least by a Metal Insulator Metal Insulator and Metal layers (double MIM) is deposited in the trench 14 on the basis electrode 12. The multilayer stack enables to realise a double MIM trench capacitor 10.

The multilayer stack comprises a first insulator layer 16 deposited on the first side 6 of the silicon substrate 4 and in the trench 14 (on the basis electrode 12), a second conductive layer 18 deposited on the first insulator layer 16, a second insulator layer 20 deposited on the second conductive layer 18 and a third conductive layer 22 deposited on the second insulator layer 20 and coupled to the basis electrode 12.

The basis electrode 12 is considered as the first conductive layer of the double MIM trench capacitor 10, and therefore it is considered as an odd conductive layer. It is the same for the third conductive layer 22 which is considered as another odd conductive layer. The second conductive layer 18 is considered as an even conductive layer. The connection between the different layers will be presented in more details hereafter. The first insulator layer 16 and the second insulator layer 20 can have same thickness, for instance equal to 0.02 µm. The first insulator layer 16 and the second insulator layer 20 are deposited for instance by a LPCVD process (Low Pressure Chemical Vapor Deposition) or ALD process (Atomic Layer Deposition) enabling to deposit a dielectric layer with a high dielectric permittivity (highK). Preferentially, the dielectric layer is a silicon nitride (Si3N4)

Thicknesses of the second conductive layer 18 and of the third conductive layer 22 are determined to control the serial resistivity of the double MIM trench capacitor 10. Polysilicon or refractory material such as tungsten (W) can be used for example to manufacture the second conductive layer 18 and the third conductive layer 22.

In another embodiment, a sequence of layers comprising a third insulating layer deposited on the third conductive layer 22 and a fourth conductive layer deposited on the third insulating layer is realised. Electrical connections between the odd conductive layers and the even conductive layers will be presented later in the description.

In another embodiment, N sequences of layers are deposited. N depends of a desired capacitor value of the trench capacitor 10.

In the capacitor structure, on one hand the even conductive layers are coupled together and one the other hand the odd conductive layers are coupled together and also shorted to the basis electrode 12. Connections between the different conductive layers are realised by implanting an interconnection layer 40 on the first side 6 of the silicon substrate 4. In this way, a parallel capacitive network is built, having one node coupled to the silicon substrate 4 and another node coupled to the interconnection layer.

To allow connection of the double MIM trench capacitor 10 to the outside of the odd conductive layer(s) (basis electrode 12 and third conductive layer 22) and of the even conducive layer (second conductive layer 18) of the trench capacitor 10, a first pad 24 and a second pad 26 are manufactured. The first pad 24 and the second pad 26 are located on the first side 6 of the silicon substrate 4 and are insulated one to another. In the structure shown on the figures, the fist pad 24 is coupled to the second conductive layer 18 and the second pad 26 is coupled to the odd conductive layers corresponding to the basis electrode 12 and the third conductive layer 22. The fabrication process of the first pad 24 and the second pad 26 will be described in more details below.

In order to decrease the serial resistivity losses and to increase the integrated capacitor density value, the self stackable capacitor structure 2 using the double MIM trench capacitor 10 is proposed. To this end, a recess 32 is realised on the opposite second side 8 of the silicon substrate 4. The capacitor structure with the recess 32 is shown on FIG. 2.

To manufacture the recess 32 (FIG. 2) the opposite second side 8 of the silicon substrate 4 is etched. The opposite second side 8 of the silicon substrate 4 is for instance mechanically grinded in a first step. The thickness achieved with mechanical grinding allows bringing the opposite second side 8 close to the bottom of the trench 14. Typical, a thickness grinded would be around 10 µm depending of the uniformity of the etching step of the trench 14 named TTV (Total Thickness Variation).

Figure 2:
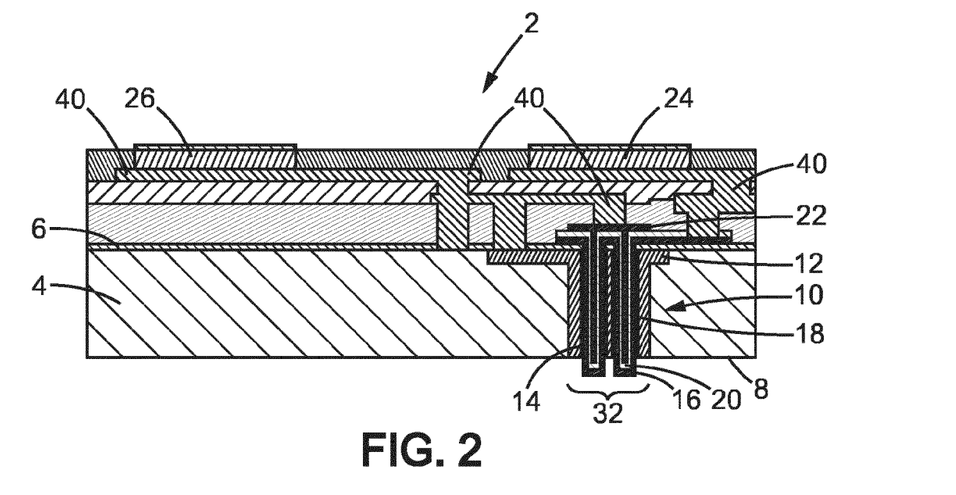
FIG. 2 is a schematic cross sectional partial view of a process step of a capacitor structure according to an embodiment of the invention.

After the mechanical grinding step, an isotropic etching of the opposite second side 8 of the silicon substrate 4 is performed using preferably dry etching method (FIG. 2). This etching step allows exposing the first insulator layer 16 thanks to an etching ratio approximately equal to 100 between the silicon (silicon substrate 4) and the silicon nitride (Si3N4) of the first insulator layer 16. Thus, a part of the first insulator layer 16 overflows to the opposite second side 8 of the silicon substrate 4. FIG. 2 shows the overflow after this etching step. In an example of embodiment of the invention a SF6 dry etching step being selective on silicon nitride (Si3N4) layer can be used.

Figure 3:
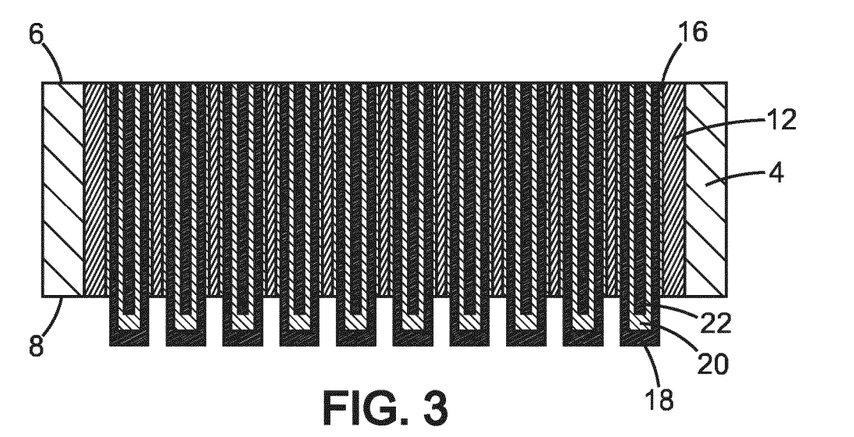
FIG. 3 is a schematic cross sectional scaled-up partial view of a process step of a self stackable capacitor structure.

In order to access of the second conductive layer 18 a local etching (FIG. 3) of the first insulator layer 16 is realised. To this end, an isotropic etching can be performed. Preferably, a wet etching is performed using for instance an orthophoshoric acid.

Figure 4:
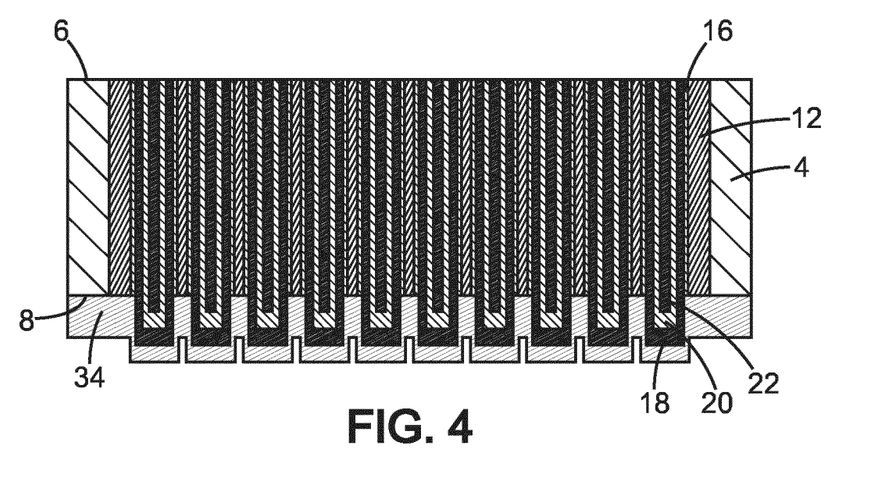
FIG. 4 is a schematic cross sectional scaled-up partial view of a process step of the self stackable capacitor structure.

To protect and to insulate the opposite second side 8 of the silicon substrate 4 (FIG. 4) and the second conductive layer 18, a deposition of a thick dielectric layer 34 is performed. The deposition is for instance an oxide deposition by PECVD (Plasma-Enhanced Chemical Vapor Deposition). The oxide deposition by PECVD of the thick dielectric layer 34 allows obtaining a conformal deposition on the even conductive layer 18.

Figure 5:
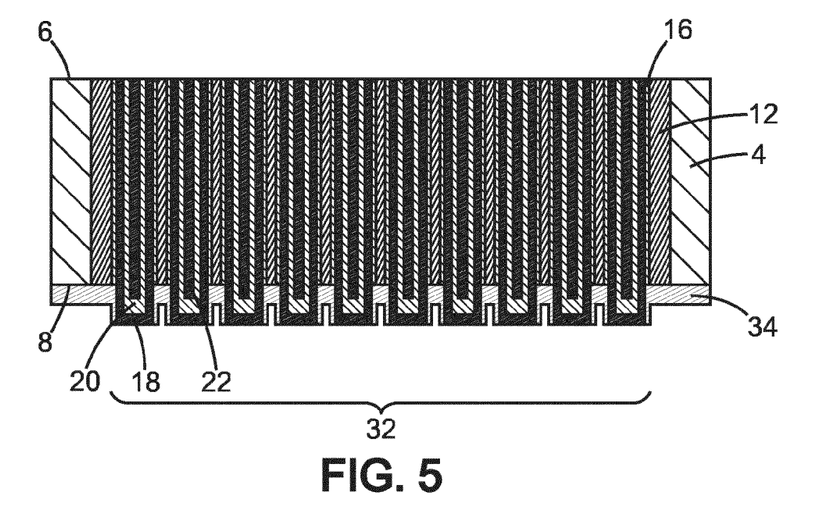
FIG. 5 is a schematic cross sectional scaled-up partial view of a process step of the self stackable capacitor structure.

A local etching step of the thick dielectric layer 34 is performed in the area of the recess 32 (FIG. 5). Preferentially, an isotropic dry etching step is performed from the opposite second side 8 of the silicon substrate 4 to expose the second conductive layer 18. The isotropic dry etching uses for instance fluorocarbon gas plasma (CF4). An alternative approach could be to use an oxide CMP (Chemical Mechanical Polishing) step implementing slurry that is sufficiently selective on the electrode to be exposed.

Figure 6:
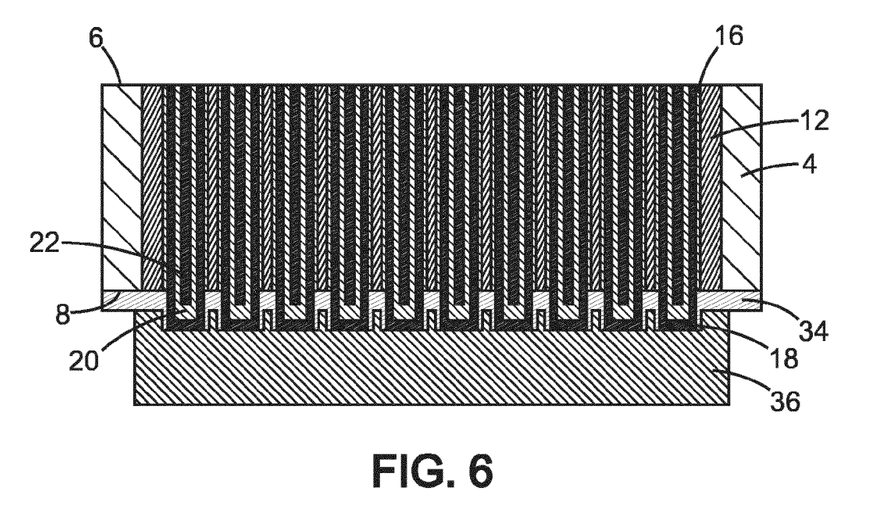
FIG. 6 is a schematic cross sectional scaled-up partial view of a process step of the self stackable capacitor structure.

A bottom metal layer 36 is deposited on the opposite second side 8 (FIG. 6). This bottom metal layer 36 can be made from aluminum (Al), titanium (Ti), copper (Cu) above a diffusion barrier layer 34a, or in combination with solderable metals like nickel (Ni) 28b protected by a thin gold (Au) 28a, or another metal or combination of metals allowing a good electrical contact with the second conductive layer 18 and the process flow presented in this description. For instance, the bottom metal layer 36 uses an electroless deposition process. The thickness of the bottom metal layer 36 is adapted to allow a deposition of a solderable layer such as for instance an Under Ball Metallization (UBM).

In order to realise connections to the outside of the capacitor structure 2 a third pad 28 and a fourth pad 30 are provided on the opposite second side 8 of the silicon substrate 4 (FIG. 7). It is clear that, to have access to the silicon substrate 4 an etching step of the thick dielectric layer 34 is realised before the fabrication process of the pads.

The third pad 28 and the fourth pad 30 are realised by a similar process than the process of fabrication of the first pad 24 and the second pad 26. The third pad 28 is coupled to the second conductive layer 18 thanks to the recess 32. In order to reduce an intrinsic capacitor resistance (ESR), the third pad 28 is deposited on the backside and is implemented to electrically short the contacted second conductive layer 18. In the illustrated embodiment, the third pad 28 is shorted to the second conductive layer 18 by the bottom metal layer 36 (which could also be a conductive polysilicon layer). By this mean, the ESR of the third pad 28 is set in parallel with a resistance of the contacted second conductive layer 18. By selecting a metal with a low resistivity like for example copper (Cu), with sufficient thickness (typ. 3 μm to 5 μm) and implementing the third pad 28 on a sufficiently large area (for example more than 60% of the second conductive layer 18 coverage), the ESR can be significantly lowered.

In the double MIM trench capacitor 10, the second conductive layer 18 is accessible from the second side 8 and is connected to the third pad 28 through the bottom metal layer 36. The second conductive layer 18 is also accessible to the first side 6 and connected to the first pad 24 through the interconnection layer 40. So the second conductive layer 18 is an intermediate electrode which can be used as a Through Substrate Via (TSV). Moreover, the basis electrode 12 is accessible from the second side 8 and is connected to the fourth pad 30 through the silicon substrate 4. The basis electrode 12 is also accessible from the top side 6 and is coupled to the second pad 26 through the interconnection layer 40 which shorts the third conductive layer 22 with the basis electrode 12. Thus, the several conductive layers (even conductive layers and odd conductive layers) can be used both as electrodes and/or as via of the double MIM trench capacitor 10 with, moreover, a controlled serial resistivity.

In order to optimise the ESR of the capacitor structure 2, a surface area of the first pad 24 has a same surface size than the surface area of the third pad 28. Furthermore, a surface area of the second pad 26 has a same surface size than a surface area of the fourth pad 30. The shape of the third pad 28 could be rectangular, polygonal or could be formed by a plurality of pads or straps. The third pad 28 covers preferably at least 60% of the even conductive layer 18.

The metal layer with the low resistivity for manufacturing the third pad 28 is also used for manufacturing the first pad 24, the second pad 26 and the fourth pad 30. In order to facilitate connections between pads and/or a support circuit a solderable layer such as an Under Ball Metallization (UBM) can be deposited on the metal layer with low resistivity used to realize the pads.

Thus, the third pad 28 is coupled to the second pad 24 by means of the even conductive layer 18 and of the interconnection layers 40 presented above. Likewise, the fourth pad 30 is coupled to the odd conductive layer 22 and to the basis electrode 12 by means of other interconnection layers 40. The fourth pad 30 is insulated to the third pad 28 and advantageously the first pad 24 is symmetrical to the third pad 28 compared to the silicon substrate 4 and, the second pad 26 is symmetrical to the third pad 28 compared to the silicon substrate 4.

Figure 8:
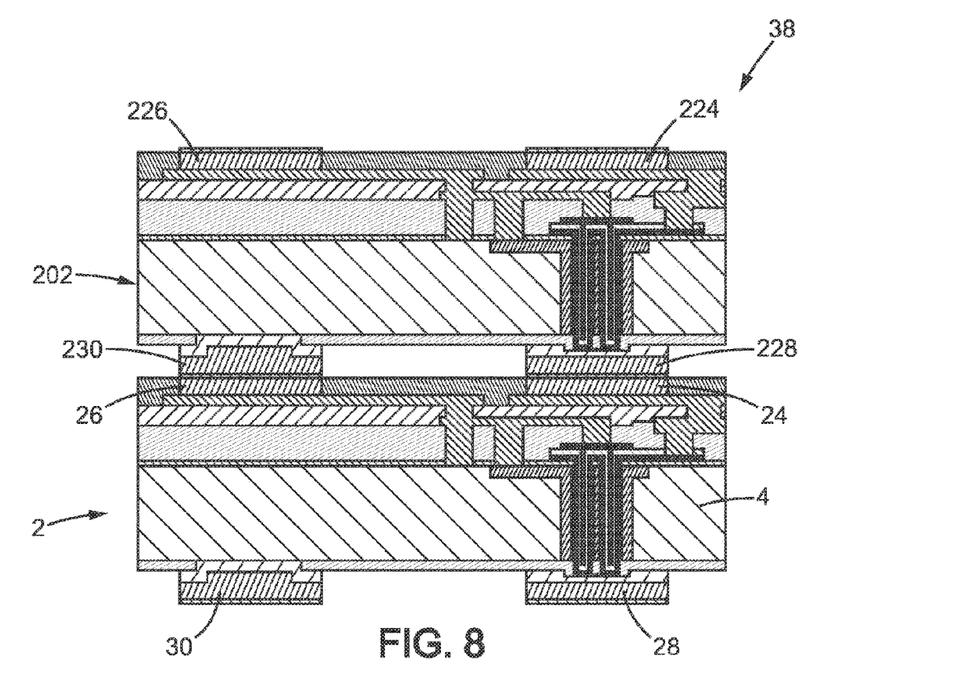
FIG. 8 is a schematic cross sectional view of an electronic device using the self stackable capacitor structure of the FIG. 7.

To increase the integrated capacitor density value, it is proposed an electronic device 38 using at least two self stackable capacitor structures 2, (FIG. 8). In the following description, the electronic device 38 comprises a first capacitor structure 2 and a second capacitor structure 202. It is noted that, internal design and characteristics of the self stackable capacitor structures 2, 202 are similar than the internal design and characteristics of the self stackable capacitor structure described above. In order to simplify the following description, the capacitor structure 2 has a capacitor value named C2 and comprises:
the first pad 24,
the second pad 26,
the third pad 28,
the fourth pad 30.

Likewise, the capacitor structure 202 has a capacitor value named C202 and comprises:
a first pad referenced 224,
a second pad referenced 226,
a third pad referenced 228,
a fourth pad referenced 230.

Thus, to realize the electronic device 38 a soldering step is realized by connecting the first pad 24 of the self stackable capacitor structure 2 to the third pad 228 of the self stackable capacitor structure 202, and the second pad 26 of the capacitor structure 2 to the fourth pad 230 of the capacitor structure 202.

In this way, the capacitor structure 2 and the capacitor structure 202 are coupled in parallel and an equivalent capacitor value of the electronic device 38 is equal to C2+C202. The third pad 28 and the fourth pad 30 of capacitor structure 2 can be connected to a printed circuit for instance.

It will appear to a person skilled in the art that a third self stackable capacitor structure similar to the capacitor structure 2 can be stacked on the second capacitor structure 202, and so on.

Advantageously, the electronic device 38 may be assembled one by one, or be assembled by using a wafer bounding process. The last process allows a cost reduction of production of the electronic device 38.

It is also proposed a process flow for manufacturing a capacitor structure 2 comprising following steps:
providing a silicon substrate 4 having a first side 6 an opposite second side 8,
forming a trench 14 in the silicon substrate 4,
forming a basis electrode 12 in the trench 14,
forming a double Metal Insulating Metal trench capacitor 10 by stacking
a first insulating layer 16,
an second conductive layer 18 on the first insulating layer 16,
a second insulating layer 20,
a third conductive layer 22 on the second insulating layer 20,
etching an opposite second side 8 of the silicon substrate 4 until the first insulating layer 16,
etching the first insulating layer 16,
depositing a thick dielectric layer 34 on the opposite second side 8,
processing a first pad 24 in connection with the first conductive layer 18 and a second pad 26 in connection with the silicon substrate 4, the first pad 24 and the second pad 26 being placed on the first side 6,
processing a third pad 28 in connection with the third conductive layer 22 and a fourth pad 30 in connection with the silicon substrate 4, the third pad 28 and the fourth pad 30 being placed on the opposite second side 8.

It is also proposed, a process flow allowing manufacturing an electronic device 38 comprising at least two self stackable capacitor structures stacked together. To this end, it is proposed to solder a first pad and a second pad of a self stackable capacitor structure to a third pad and a fourth pad of the neighbouring self stackable capacitor structure. The self stackable capacitor structures are placed one below the other.

The present invention provides a capacitor structure 2 which is easy to manufacture. The invention also provides (when the number of self stackable capacitor structure is higher than 2) an electronic device 38 with a high integrated capacitor density value and with controlled serial resistor losses.

While the invention has been illustrated and described in details in the drawings and foregoing description, such illustration and description have to be considered as illustrative or exemplary and not restrictive; the invention is not limited to the disclosed embodiments. Variations to the disclosed embodiments can be understood and effected by those skilled in the art in practicing the claimed invention, from a study of the drawings, the disclosure, and the appended claims

The invention claimed is:

1. A capacitor structure comprising:
   a silicon substrate with a first side and an opposite second side parallel to the first side,
   a trench etched in the semiconductor substrate from the first side,
   a double Metal Insulator Metal trench capacitor including along at least one stacking direction which is parallel to both the first side and the opposite second side of the silicon substrate:
      a basis electrode forming a first conductive layer sunk in the trench and coupled to the substrate,
      a first insulator layer stacked on the basis electrode in the trench,
      a second conductive layer stacked on the first insulator layer in the trench,
      a second insulator layer stacked on the second conductive layer in the trench, and
      a third conductive layer stacked on the second insulator layer in the trench and coupled to the basis electrode,
   wherein a second pad and a fourth pad are coupled to the basis electrode, wherein the second pad is located on the first side of the silicon substrate and the fourth pad is located on the opposite second side of the silicon substrate, and
   in that a first pad and a third pad are coupled together and insulated from the silicon substrate and from the second pad and the fourth pad, the first pad being located on the first side of the silicon substrate, the third pad being located on the opposite second side of the silicon substrate, the third pad being coupled to the second conductive layer, and said second conductive layer being flush with or protruding from said opposite second side of the silicon substrate.

2. A capacitor structure according to claim 1, wherein the second pad and the fourth pad are coupled by the silicon substrate to the basis electrode.

3. A capacitor structure according to claim 1, wherein the first pad and the third pad are in line with each other along a direction perpendicular to both the first side and the opposite second side of the silicon substrate.

4. A capacitor structure according to claim 1, wherein the second pad and the fourth pad are in line with each other along a direction perpendicular to both the first side and the opposite second side of the silicon substrate.

5. A capacitor structure according to claim 1, wherein the third pad shorts the second conductive layer.

6. A capacitor structure according to claim 1, wherein the pads are formed with copper.

7. A capacitor structure according to claim 1, wherein the third pad covers more than 60% of the second conductive layer.

8. A capacitor structure according to claim 1, wherein a third insulating layer is deposited on the third conductive layer and a fourth conductive layer is deposited on the third insulating layer.

9. A capacitor structure according to claim 8, wherein the second and fourth conductive layers are coupled together, and the first and third conductive layers are coupled together.

10. A capacitor structure according to claim 1, wherein it further comprises a bottom metal layer deposited on the opposite second side of the silicon substrate, said bottom metal layer being made of aluminium, titanium or copper, above a diffusion barrier layer, or in combination with nickel protected by thin gold, said bottom metal layer being adapted to allow deposition of a solderable layer.

11. An electronic device comprising more than one capacitor structure according to claim 1, wherein a first pad and a second pad of a capacitor structure are soldered to a third pad and a fourth pad of a second neighbouring capacitor structure.

12. An electronic device according to claim 11, wherein the capacitor structures are placed one above another.

13. A method for manufacturing an electronic device using two neighbouring capacitor structures each according to claim 1, wherein it also comprises a step of:
   soldering the first pad and the second pad of a first one of the capacitor structures to the third pad and the fourth pad of the second one of the capacitor structures.

14. A method for manufacturing an electronic device according to claim 13, wherein the soldering step is a wafer bonding.

15. A method for manufacturing a capacitor structure comprising the steps of:
   providing a silicon substrate having a first side and an opposite second side parallel to the first side,
   forming a trench in the silicon substrate from the first side,
   forming a basis electrode in the trench, and coupled to the substrate,
   forming a double Metal Insulating Metal trench capacitor by stacking in the trench along at least one stacking direction which is parallel to both the first side and the opposite second side of the silicon substrate:
      a first insulating layer on the basis electrode which forms a first conductive layer,
      a second conductive layer on the first insulating layer,
      a second insulating layer on the second conductive layer,
      a third conductive layer on the second insulating layer,
   etching the opposite second side of the silicon substrate until the first insulating layer,
   etching the first insulating layer,
   depositing a thick dielectric layer on the opposite second side,
   processing a first pad in connection with the second conductive layer and a second pad in connection with the silicon substrate and the third conductive layer, the first pad and the second pad being placed on the first side, and
   processing a third pad in connection with the second conductive layer and a fourth pad in connection with the silicon substrate, the third pad and the fourth pad being placed on the opposite second side.

16. A method for manufacturing a capacitor structure according to claim 15, wherein it also comprises the steps of:
   depositing a third insulator layer on the third conductive layer, and depositing a fourth conductive layer on the third insulator layer.

\* \* \* \* \*